(12) United States Patent
Blanchard

(10) Patent No.: US 6,812,056 B2
(45) Date of Patent: Nov. 2, 2004

(54) TECHNIQUE FOR FABRICATING MEMS DEVICES HAVING DIAPHRAGMS OF "FLOATING" REGIONS OF SINGLE CRYSTAL MATERIAL

(75) Inventor: Richard A. Blanchard, Los Altos, CA (US)

(73) Assignee: JBCR Innovations, Inc., Dallas, TX (US)

(*) Notice: Subject to any disclaimer, the term of this patent is extended or adjusted under 35 U.S.C. 154(b) by 0 days.

(21) Appl. No.: 10/382,256

(22) Filed: Mar. 5, 2003

(65) Prior Publication Data
US 2004/0175855 A1 Sep. 9, 2004

(51) Int. Cl.⁷ .............................................. H01L 21/00
(52) U.S. Cl. ...................................................... 438/50
(58) Field of Search ............................ 438/48, 50, 52, 438/53, 738

(56) References Cited

U.S. PATENT DOCUMENTS

| | | |
|---|---|---|
| 4,592,802 A | 6/1986 | Deleonibus et al. |
| 4,824,795 A | 4/1989 | Blanchard |
| 4,920,639 A | 5/1990 | Yee |
| 5,426,070 A * | 6/1995 | Shaw et al. .................. 216/2 |
| 5,891,797 A | 4/1999 | Farrar |
| 6,020,215 A | 2/2000 | Yagi et al. |
| 6,060,381 A | 5/2000 | Nakagawara et al. |
| 6,166,436 A | 12/2000 | Maeda et al. |
| 6,204,098 B1 | 3/2001 | Anceau |
| 6,277,703 B1 | 8/2001 | Barlocchi et al. |
| 6,331,470 B1 | 12/2001 | Sanfilippo et al. |

OTHER PUBLICATIONS

Kelly, et al., Galvanic Cell Formation: A Review of Approaches to Silicon Etching for Sensor Fabrication, Aug. 2001, IEEE Sensors Journal, vol. 1, No. 2, p. 127–142.

Lee, The Fabrication of Thin, Freestanding, Single–Crystal, Semiconductor Membranes, Aug. 1990, J. Electrochem. Soc., vol. 137, No. 8, p. 2556–2574.

* cited by examiner

Primary Examiner—Craig A. Thompson
(74) Attorney, Agent, or Firm—Richard K. Robinson

(57) ABSTRACT

A single crystal semiconductor region is fabricated in a semiconductor wafer. The region is either cantilevered, supported at one or both ends, or midpoint, or supported at multiple locations. After a pattern and etch step, a dielectric fill step is performed to define the boundaries of the region in the semiconductor wafer. Oxygen or nitrogen is implanted in the semiconductor wafer on a surface area of the semiconductor wafer that corresponds to a top surface of the region. The annealing of the oxygen or nitrogen ions convert the silicon to an oxide or a nitride beneath the surface area. The silicon dioxide or silicon nitride is etched away to produce a semiconducting region of a single crystal material.

40 Claims, 4 Drawing Sheets

TECHNIQUE FOR FABRICATING MEMS DEVICES HAVING DIAPHRAGMS OF "FLOATING" REGIONS OF SINGLE CRYSTAL MATERIAL

BACKGROUND OF THE INVENTION

This invention relates to Microelectromechanical Structure, or MEMS, and the method of fabricating such devices.

Microelectromechanical Structures, or "MEMS" often consist in part, of polycrystalline semiconductor regions that are only partially attached to the underlying material. Such polycrystalline silicon regions, which may be cantilevered, center supported or supported at both ends are hereinafter referred to as "regions". They are typically formed by depositing polysilicon on a layer of sacrificial material such as a silicon nitride, silicon dioxide, or another dielectric. Often the polysilicon material, either doped or undoped as required by the design, is masked and patterned using a photolithographic process to define the desired structure(s). The underlying sacrificial layer is partially or totally removed, leaving the layer of polysilicon material unsupported except at selected support locations. This sequence of steps allows the fabrication of structures such as beams, which might be supported at one or both ends as well as diaphragms and other shapes and structures that are characterized by only being supported at selected points. In some MEMS, the polysilicon structure that is formed by the removal of the sacrificial layer may not be permanently attached, but may be constrained, allowing it even greater freedom. The use of polysilicon is sufficient in some applications, but the strength of polysilicon and its resistance to crack formation and associated mechanical failure are not as high as those of single crystal materials.

One prior art method for forming these regions involves depositing an etch stop layer of silicon nitride in direct contact with or above the semiconductor material substrate. Next a sacrificial layer of silicon dioxide is deposited on top of the etch stop layer of silicon nitride. A region of polysilicon is then deposited, masked, patterned and etched on the layer of sacrificial material. The underlying sacrificial layer of silicon dioxide is partially or totally removed, leaving the layer of polysilicon material "floating" and unsupported except at some locations.

The mechanical properties of these floating regions may become more important with the continuing miniaturization of integrated circuits. The ever increasing complexity of integrated devices having greater numbers of wiring channels coupled with the desire for packing chips closer together to minimize transmission delays, results in the need for multilayered and high channel density interconnect substrates. Also, with higher interconnect wiring density, the need for using insulators with low dielectric constants becomes more important for performance reasons. Insulators with the low dielectric constants include vacuum, gases such as air, and depending upon the temperature, single crystalline silicon. The present invention is also directed to fabricating interconnect substrates with air as the dielectric in a process which allows the formation of floating single crystal structures.

FIGS. 1, to which reference should now be made, illustrates a representation of the sequence of steps used to manufacture the prior art microelectromechanical (MEMS) devices.

Starting with a semiconductor material substrate 12, in FIG. 1a, an etch stop layer 15 of silicon nitride is deposited in direct contact with the substrate, and then a sacrificial layer 1 of silicon dioxide is deposited on top of the etch stop layer 15 of silicon nitride.

Referring to FIG. 1b, A region of polysilicon 4 is then deposited, masked, patterned and etched on the layer of sacrificial material 1.

After the step illustrated in FIG. 1b, as shown in FIG. 1c, the underlying sacrificial layer 1 of silicon dioxide is partially or totally removed which leaves the layer of polysilicon material 4 "floating" and unsupported at some locations 5.

In a related area of art, air bridges are growing in importance with the advancement of speed requirements. An example of air bridges in five (5) layers is disclosed in U.S. Pat. No. 4,920,639 dated May 1, 1990, which is hereby incorporated by reference, describes "a method of building a multilevel electrical interconnect supported by metal pillars with air as a dielectric. The metal conductors and metal support pillars are formed using a photo-imagible polymer which serves the function of patterning and also provides a temporary support during construction".

Another useful invention is described in U.S. Pat. No. 5,891,797 dated Apr. 6, 1999, which is hereby incorporated by reference, and states that "a process of manufacturing integrated circuits is disclosed for designing and implementing a hierarchical wiring system. The interconnection requirements are sorted and designed into a particular wiring level according to length. Support structures may be constructed to allow more flexibility in designing air bridge dimensions. The support structures may take the form of lateral ribs or intermediate posts, and may be fabricated of either insulating or conductive material. One integrated circuit described is a memory device, such as a dynamic random access memory". U.S. Pat. No. 6,020,215 dated Feb. 1, 2000, which is hereby incorporated by reference, and describes "a microstructure comprising a substrate (1), a patterned structure (beam member) (2) suspended over the substrate (1) with an air-space (4) there between and supporting structure (3) for suspending the patterned structure (2) over the substrate (1). The microstructure is prepared by using a sacrificial layer (7) which is removed to form the space between the substrate (1) and the patterned structure (2) adhered to the sacrificial layer. In the case of using resin as the material of the sacrificial layer, the sacrificial layer can be removed without causing sticking, and an electrode can be provided on the patterned structure. The microstructure can have application as electrostatic actuator, etc., depending on choice of shape and composition".

The assembly of air bridges require inter-connecting surfaces as shown U.S. Pat. No. 6,060,381 dated May 9,2000, which is hereby incorporated by reference and describes "an electronic part having an air-bridge interconnection with a flat air-bridge interconnection body, no interconnection loss, high Q and low power consumption. Also disclosed is a method of manufacturing such electronic parts. The flat air-bridge interconnection body is obtained by conducting two-stage selective plating including selective plating for forming posts on post base electrodes and selective plating for forming the air-bridge interconnection body".

Thus, it can be shown that there is a need for beams or bridges that are only partially supported. These beams have application in the microelectronical structure art as well as in the air bridge art.

SUMMARY OF INVENTION

A single crystal semiconductor region is fabricated in a semiconductor wafer. The region may be cantilevered, supported at both ends, or supported at points along its length. An etch and oxide fill step or an oxide formation step is performed to define the boundaries of the region in the semiconductor wafer. Oxygen is implanted into the semiconductor wafer beneath a surface area of the semiconductor wafer that corresponds to a top surface of the beam and at least part of the surrounding oxide boundary region. Annealed oxygen ions convert the semiconductor material beneath the surface area to silicon dioxide. The silicon dioxide is etched away to produce a semiconducting region of a single crystal material.

This invention disclosure describes a technique for fabricating Microelectromechanical (MEMS) devices, and other semiconductor beam type structures, which allow the formation of single crystal beams instead of polysilicon regions. The method includes depositing and defining an etch stop layer on the surface of a substrate covering all areas that will not become a single crystal region. The etch stop layer can be composed of materials selected from a group which would include silicon nitride ($Si_3N_4$) and doped silicon dioxide ($SiO_2$). Photolithography, trench etch, and oxide fill steps are performed to define the shape of the single crystal region. A blocking layer of photoresist or other material is then deposited and defined using a photolithography process on the surface of the etch stop layer to prevent the ion implantation of oxygen where it is not desired. The single crystal structure is formed by a high dose implantation of oxygen to begin to convert the silicon or other material to an oxide below the surface of the single crystal material. An anneal operation is performed to complete the conversion of the material to oxide. Both the oxide region surrounding the single crystal material on its sides and the oxide layer formed by implantation of oxygen below the surface are etched away, which produces a cantilevered beam or similar structure of single crystal semiconductor material. Nitrogen may be substituted for oxygen in the implantation step, and the trench may be filled with silicon nitride in another version.

In another embodiment of the invention, overlapping regions of single crystal silicon are formed by repeating and modifying the process steps that are shown in the FIGS. 2.

Another embodiment could include epitaxially depositing additional single crystal material to increase the thickness of the single crystal region, thereby creating an air bridge structure of single crystal semiconductor material.

Yet another embodiment of the invention fabricates multiple layers of single crystal silicon by using similar steps to those in FIGS. 2 and 3, but including the deposition of metal in via's, implanting oxygen, etching away the oxide region leaving a single crystal semiconductor material air bridge supported by metal posts. For these applications, a refractory metal such as tungsten, which can withstand high temperatures and can also form ohmic contacts to semiconductors may be used if electrical contact to the single crystal bridge(s) is desired, and high temperature processing is to occur following formation of th metal posts. Otherwise aluminum its alloys, or other metals could be used.

The practice of this invention can also create DMD (Deformed Mirror Device) and air bridge devices with an accurate and simple technique.

DETAILED DESCRIPTION OF THE EMBODIMENTS

FIGS. 2, to which reference should now be made, illustrates a representation of the sequence of steps used to manufacture microelectromechanical (MEMS) devices with a process that allows the formation of floating or cantilevered single crystal structures instead of the polysilicon structures used in the prior art.

Figure 1A:
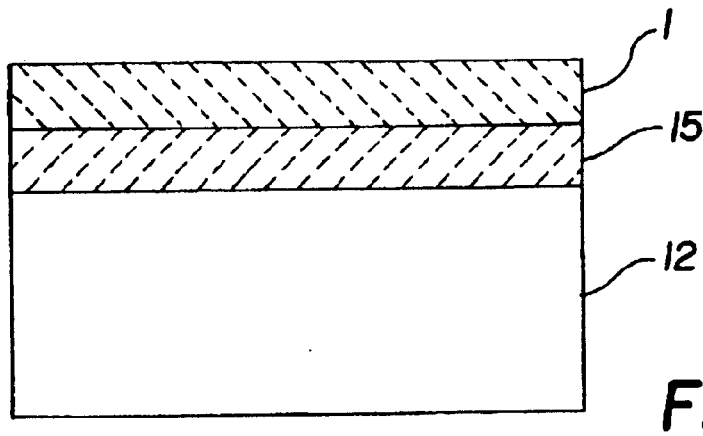
FIGS. 1a–1c illustrates a prior art process showing the use of a sacrificial layer and polycrystalline material to fabricate a cantilevered region.
Figure 1B:
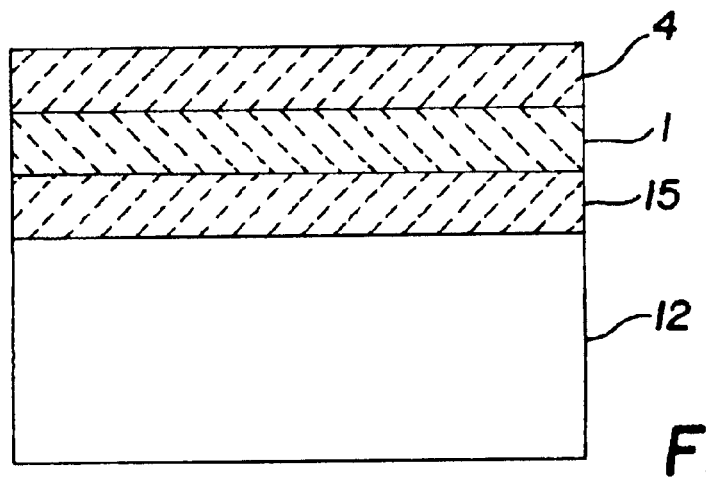
Figure 1C:
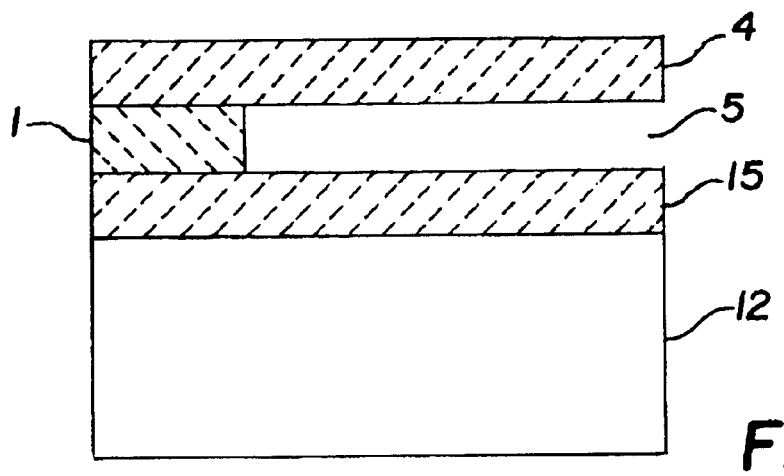
Figure 2A:
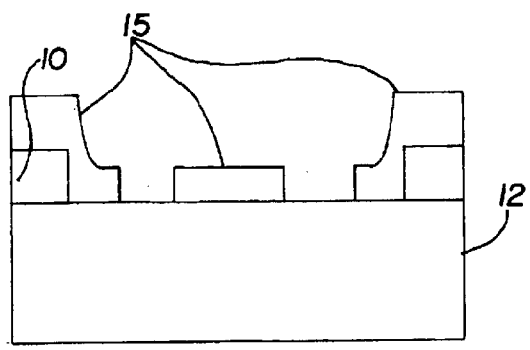
FIGS. 2a–2f illustrates steps used to fabricate floating structures of single crystal silicon.
Figure 2B:
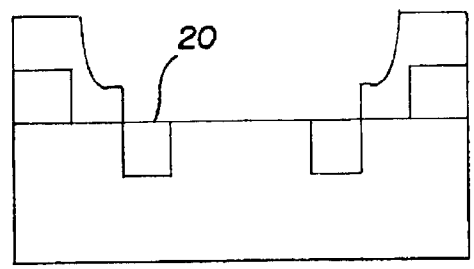

In FIG. 2a, an etch stop layer 15 such as silicon nitride is deposited over existing structures 11 using a vapor deposition process typically in the temperature range of 800° C.–900° C., and then masked and etched, leaving the nitride in direct contact with the surface of a single crystalline substrate at the boundaries of all regions that will not become floating structures, leaving regions that will become floating structures in between In FIG. 2b, using a thermal oxidation furnace in a temperature range of 800° C.–1250° C., perform a local oxidation of silicon (LOCOS) process sequence after a trench etch step. This process sequence can include any of the known variations of polysilicon buffered LOCOS, side wall mask isolation (SWAMI), or trench etch and refill, using a plasma reactor. Following this process sequence, and a subsequent mask and etch step to remove unwanted nitride, an oxide filled region 20 defines the boundaries of the single crystal structure. Alternately 20 may consist of CVD silicon nitride that has been etched to leave the nitride in just the trenches.

Figure 2C:
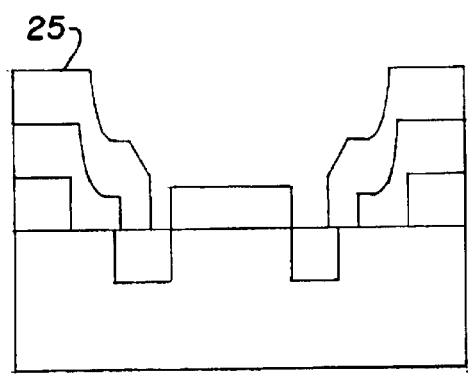

In FIG. 2c, a blocking layer 25 of photo resist or another material is applied using a metered resist dispenser and spin technique. A photolithography process step is used on the surface of the photoresist to define the area for the ion implantation of oxygen or nitrogen.

Figure 2D:
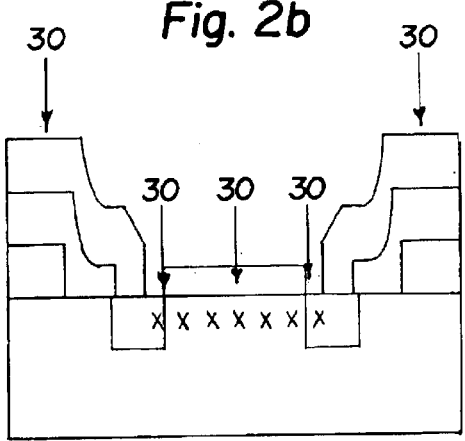

In FIG. 2d, a high dose oxygen or nitrogen ion implant 30, normally in the range of $10^{17}$–$10^{18}$ ions/cm$^2$ utilizing a high current (20 mA–100 mA) implant machine is performed to begin to convert the silicon to an oxide or nitride below the surface of the previously defined area of the substrate of single crystal material. The blocking layer is used to etch the center nitride region and then the blocking layer is removed using a wet chemical or a dry plasma etching process, though in some applications, the silicon nitride may be left on the center region.

Figure 2E:
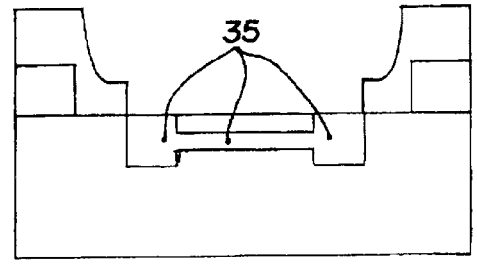

In FIG. 2e, an anneal process 35 is performed at a temperature above 600° C. using a process from a group which includes a furnace anneal over a period of many minutes and rapid thermal anneal (RTA) over a few seconds to complete the conversion of the implanted material to an oxide or a nitride.

Figure 2F:
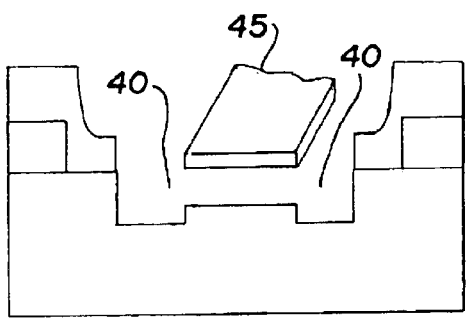

In FIG. 2f, both the oxide region surrounding the single crystal semiconductor region and the oxide or nitride layer formed by ion implanting and annealing the oxygen or nitrogen beneath the surface of single crystal semiconductor material substrate 12 are etched away 40, using either a wet etch or a dry plasma etching process. This produces a floating structure or a structure that is connected to the original semiconductor substrate at one or more locations that is of single crystal semiconductor material 45.

While FIG. 2 has the oxygen or nitrogen implant and anneal step (FIG. 2d) before the trench formation step (FIG. 2c), the order of these two steps could be reversed while maintaining the ability to form the same structures of floating or cantilevered single crystal semiconductor material. The thickness of the resulting single crystal structure could also be increased by selective epitaxial growth or epitaxial and poly deposits followed by an etch back step.

FIGS. 3, to which reference should now be made, illustrates the sequence of steps used to manufacture microelectromechanical (MEMS) devices with a process which allows the formation of floating or cantilevered single crystal silicon structures at different depths into the substrate.

Figure 3A:
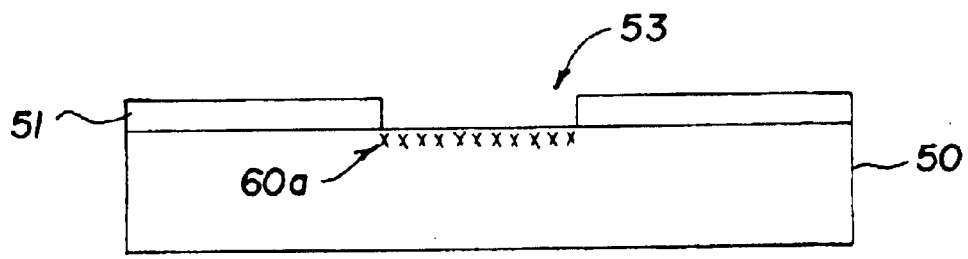
FIGS. 3a–3d illustrates the results of a repetitive process used in FIGS. 2 to fabricate multiple layers of floating or cantilevered structures of single crystal silicon.
Figure 3B:
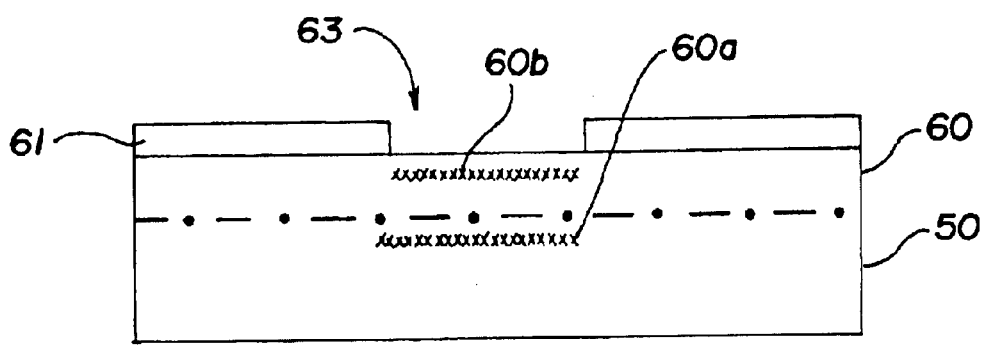

FIG. 3a shows the substrate following an oxide formation step to produce oxide layer 51, masking and etch steps to produce opening 53, and an ion implantation step using oxygen or nitrogen as the implanted species to produce region 60a. A high does oxygen or nitrogen ion implantation, normally in the range of $10^{17}$–$10^{18}$ ions/cm$^2$ utilizing a high current (20 mA–100 mA) is performed to begin to convert the semiconductor to an oxide or nitride layer below the surface of the single crystal substrate. A thin layer of oxide may then be grown, which may also anneal the implanted oxygen or nitrogen to form a dielectric layer, while simultaneously forming a step in the surface of the substrate, which allows for the alignment of subsequent masking layers. The oxide blocking layer and any additional thermally grown oxide are removed, and a layer of epitaxial semiconductor 60 is deposited over the entire wafer. Next a layer of oxide 61 is formed, masked, and etched, and a second oxygen or nitrogen ion implantation step is performed through opening 63 as shown in FIG. 3b to form region 60b, which is shown being above region 60a in this figure region 60b may be in any relative position to region 60a, allowing the formation of semiconductor regions more complex than just identical stacked regions.

Figure 3C:
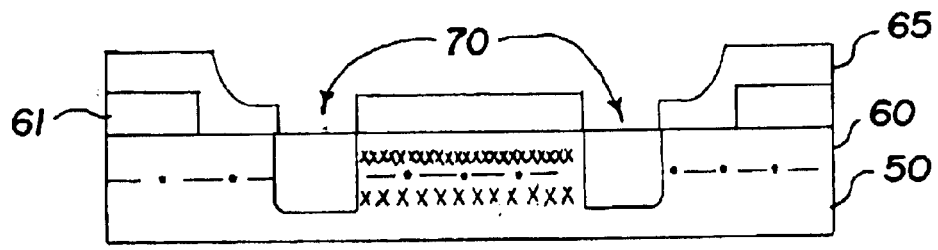

In FIG. 3c, as was illustrated in FIG. 2a, etch stop layer 65 such as silicon nitride is deposited, using a vapor phase process in the temperature range of 800° C.–900° C., in direct contact with the surface of the substrate at the boundaries of all regions that will not become floating structures. Using a thermal oxidation furnace in a temperature range of 800° C.–1250° C. to perform a local oxidation silicon (LOCOS) step, after a trench etch step which may include any variations of polysilicon buffered LOCOS, side wall mask isolation (SWAMI), and trench etch, using a plasma reactor is performed with an oxide fill step 70 to define the shape of the surface boundaries of the single crystal structure. Alternately, 70 may consist of CVD silicon nitride that has been etched to leave the nitride in just the trenches.

Figure 3D:
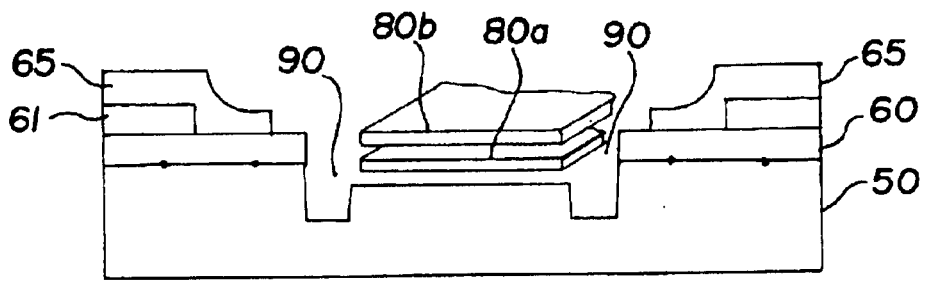

In FIG. 3d, both the oxide or nitride regions surrounding the single crystal semiconductor regions and the oxide or nitride layers formed by ion implanting the oxygen or nitrogen beneath the single crystal semiconductor material are etched away 90, using a wet etch or a dry plasma etching process. The masking process used for etching in conjunction with the etch rates between the oxide or nitride and the semiconductor material result in corner supports for the region of single crystal semiconductor material. This results in the formation of the first and second single crystal silicon structures 80a and 80b.

Although only two vertical structures are shown in FIG. 3, by growing additional epitaxial layers and performing ion implants, many vertical structures 80 may be fabricated. Additionally the process may also be used to fabricate multiple structures on a single epitaxial layer.

Figure 4:
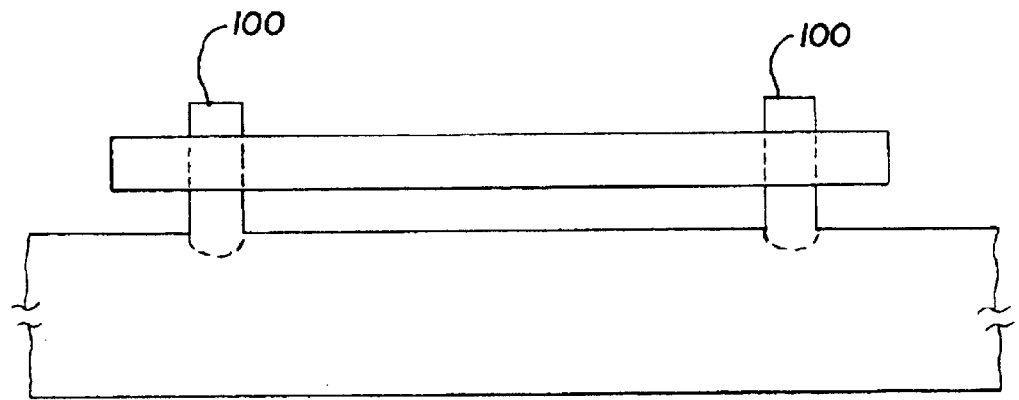
FIG. 4 illustrates an air bridge of one layer of single crystal silicon with metal posts supporting both ends that has been fabricated using the teachings of this disclosure.
Figure 5:
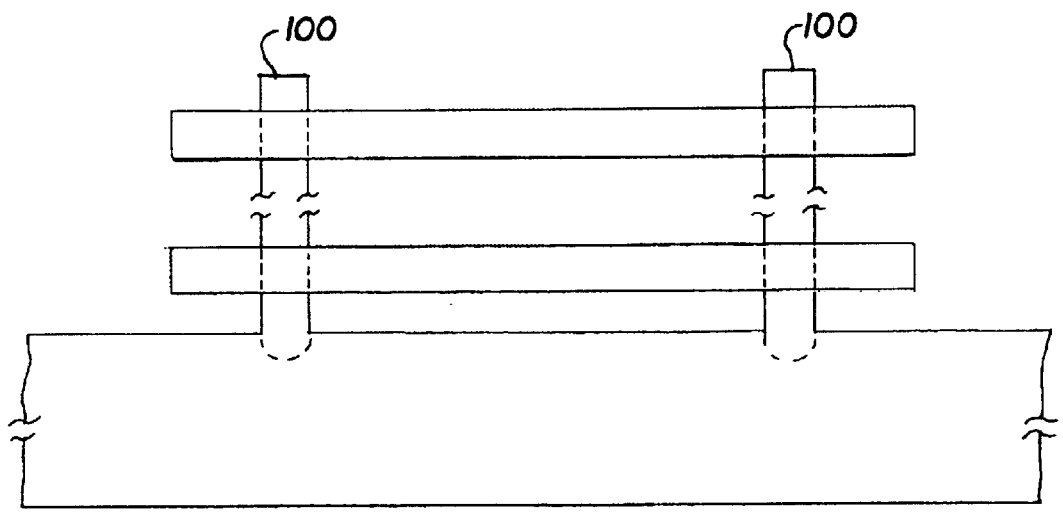
FIG. 5 illustrates an air bridge of multiple layers of single crystal silicon with metal posts supporting both ends that has been fabricated using the teachings of this disclosure.

The single crystal region(s) shown in FIGS. 2 and 3 may also be supported and electrically contacted by one or more electrically conductive posts 100 that are incorporated into the structure as shown in FIGS. 4 and 5 prior to the etch stip that removes the sacrificial layer from around the single crystal region(s). The metal posts may consist of any conductor such as aluminum, copper or tungsten. If no further high temperature steps are to be performed, aluminum or copper are appropriate. However, if further high temperature steps are required, a refractory metal such as tungsten should be used. The metal posts are similar to the metal "plugs" used to connect conductive leads on two different metal layers and would be formed in the same fashion. First, one or more openings are etched using conventional photolithographic patterning and etching techniques. Next, the electrically conductive post(s) are formed using deposition or plating techniques followed by an etching or polishing step (if needed) to leave just the post(s). These conductive posts may be fabricated from a list of materials including metals, alloys of metals, silicides and doped polycrystalline semiconductors.

I claim:

1. A method for fabricating a semiconductor region having a single crystal structure that is supported at one or more locations, comprising the steps of:

depositing and defining an etch stop layer on a first surface of a semiconductor wafer;

creating a dielectric border to define the boundaries of a predetermined shape of the single crystal structure on the first surface of the epitaxial layer;

applying a blocking layer to the first surface;

masking the first surface according to the predetermined shape to create an implant area on the first surface;

implanting ions into the implant area;

annealing the semiconductor wafer to create a temporary region of dielectric in the semiconductor area beneath the implanted area; and removing both the dielectric border and the temporary region to achieve the predefined shape of the single crystal structure.

2. The method of claim 1 wherein the step of depositing and defining an etch stop layer on a first surface of a semiconductor wafer, further comprises depositing a material selected from the group that includes nitrides and oxides on the surface of the substrate.

3. The method of claim 1 wherein the steps of creating a dielectric border to define the boundaries of a predetermined shape of the single crystal structure on the first surface of the epitaxial layer further comprises establishing a perimeter for the single crystal structure of a dielectric material.

4. The method of claim 3 further comprising performing an oxidation step selected from a group that includes: LOCOS, polysilicon-buffered LOCOS, and SWAMI technique.

5. The method of claim 1 wherein the step of masking further comprises: applying a blocking layer of photoresist to the first surface on the areas of the etch stop layer where ion implantation is not desired.

6. The method of claim 5 further comprising the step of removing the blocking layer of photoresist.

7. The method of claim 1 wherein the step of ion implantation further comprises converting the semiconductor material to an oxide or a nitride below the single crystal material.

8. The method of claim 1 wherein the step of annealing further comprises annealing the semiconductor wafer to create a temporary region in the semiconductor area beneath the implanted area to convert the semiconductor area to an oxide or a nitride.

9. The method of claim 1 wherein the step of removing the temporary region to achieve the predefined shape of the single crystal structure comprises etching both the dielectric region surrounding the single crystal structure and the subsurface dielectric layer formed by ion implantation step.

10. A method of fabricating an air bridge, comprising the steps of:
   depositing and defining an etch stop layer on a first surface of a semiconductor wafer;
   creating a dielectric border to define the boundaries of a predetermined shape of the single crystal structure on the first surface of the semiconductor wafer;
   applying a blocking layer to the first surface;
   masking the first surface according to the predetermined shape to create an implant area on the first surface;
   implanting ions into the implant area;
   annealing the semiconductor wafer to create a temporary region of dielectric in the first epitaxial area beneath the implanted area;
   removing both the dielectric border and the temporary region to achieve the predefined shape of the single crystal structure.

11. The method of claim 10 wherein the step of depositing and defining the etch stop layer on a first surface of a semiconductor wafer, further comprises depositing a material selected from the group that includes nitrides and oxides on the surface of the substrate.

12. The method of claim 10 wherein the steps of creating a dielectric border to define the boundaries of a predetermined shape of the single crystal structure on the first surface of the epitaxial layer further comprises establishing a perimeter for the single crystal structure.

13. The method of claim 12 further comprising performing an oxidation step selected from a group that includes: LOCOS, polysilicon-buffered LOCOS, and SWAMI technique.

14. The method of claim 10 wherein the step of masking further comprises: applying a blocking layer of photoresist to the first surface on the areas of the etch stop layer where ion implantation is not desired.

15. The method of claim 14 further comprising the step of removing the blocking layer of photoresist.

16. The method of claim 10 wherein the step of ion implantation further comprises converting the semiconductor material to an oxide or a nitride below the single crystal material.

17. The method of claim 10 wherein the step of annealing further comprises annealing the semiconductor wafer to create a temporary region in the semiconductor area beneath the implanted area to convert the semiconductor area to an oxide or a nitride.

18. The method of claim 10 wherein the step of removing the temporary region to achieve the predefined shape of the single crystal structure comprises etching both the dielectric region surrounding the single crystal structure and the subsurface dielectric layer formed by ion implantation step.

19. A method for fabricating a semiconductor region having a single crystal structure that is supported at one or more locations, comprising the steps of:
   depositing and defining an etch stop layer over an epitaxial layer on a first surface of a semiconductor wafer;
   creating a dielectric border to define the boundaries of a predetermined shape of the single crystal structure on the first surface of the epitaxial layer;
   applying a blocking layer to the first surface;
   masking the first surface according to a predetermined shape to create an implant area on the first surface;
   implanting ions into a implant area;
   annealing the semiconductor wafer to create a temporary region in the first epitaxial area beneath the implanted area; and
   removing both the dielectric border and the temporary region to achieve the predefined shape of the single crystal structure.

20. The method of claim 19 wherein depositing and defining an etch stop layer over an epitaxial layer on a first surface of a semiconductor wafer, further comprises depositing a material selected from the group that includes nitrides and oxides on the surface of the substrate.

21. The method of claim 19 wherein the steps of creating a dielectric border to define the boundaries of a predetermined shape of the single crystal structure on the first surface of the epitaxial layer further comprises establishing a perimeter for the single crystal structure.

22. The method of claim 21 further comprising performing an oxidation step selected from a group that includes: LOCOS, polysilicon-buffered LOCOS, and SWAMI technique.

23. The method of claim 19 wherein the step of masking further comprises: applying a blocking layer of photoresist to the first surface on the areas of the etch stop layer where ion implantation is not desired.

24. The method of claim 23 further comprising the step of removing the blocking layer of photoresist.

25. The method of claim 19 wherein the step of ion implantation further comprises converting the semiconductor material to an oxide or a nitride below the single crystal material.

26. The method of claim 19 wherein the step of annealing further comprises annealing the semiconductor wafer to create a temporary region in the semiconductor area beneath the implanted area to convert the semiconductor area to an oxide or a nitride.

27. The method of claim 19 wherein the step of removing the temporary region to achieve the predefined shape of the single crystal structure comprises etching both the dielectric region surrounding the single crystal structure and the subsurface dielectric layer formed by ion implantation step.

28. A method of fabricating an air bridge, comprising the steps of:
   depositing and defining an etch stop layer on a first surface of a single crystal semiconductor wafer;
   creating a dielectric border to define the boundaries of a predetermined shape of the single crystal structure on the first surface of the semiconductor wafer;
   applying a blocking layer to the first surface;
   masking the first surface according to the predetermined shape to create an implant area on the first surface;
   implanting ions into the implant area;
   annealing the semiconductor wafer to create a temporary region in the first area beneath the implanted area;
   removing both the dielectric border and the temporary region to achieve the predefined shape of the single crystal structure.

29. The method of claim 28 wherein the step of depositing and defining the etch stop layer on a first surface of a semiconductor wafer, further comprises depositing a material selected from the group that includes nitrides and oxides on the surface of the substrate.

30. The method of claim 28 wherein the steps of creating a dielectric border to define the boundaries of a predetermined shape of the single crystal structure on the first surface of the wafer further comprises establishing a perimeter for the single crystal structure.

31. The method of claim 30 further comprising performing an oxidation step selected from a group that includes: LOCOS, polysilicon-buffered LOCOS, and SWAMI technique.

32. The method of claim 28 wherein the step of masking further comprises: applying a blocking layer of photoresist to the first surface on the areas of the etch stop layer where ion implantation is not desired.

33. The method of claim 32 further comprising the step of removing the blocking layer of photoresist.

34. The method of claim 28 wherein the step of ion implantation further comprises converting the semiconductor material to an oxide or a nitride below the single crystal material.

35. The method of claim 28 wherein the step of annealing further comprises annealing the semiconductor wafer to create a temporary region in the semiconductor area beneath the implanted area to convert the semiconductor area to an oxide or a nitride.

36. The method of claim 28 wherein the steps of etching further comprises removing the temporary region to achieve the predefined shape of the single crystal structure from both the dielectric region surrounding the single crystal structure and the subsurface dielectric layer formed by ion implantation step.

37. The method of claim 28 further comprising the step of depositing an additional epitaxial layers on the semiconductor material to increase the single crystal thickness, and implanting oxygen into this additional layer, annealing after all implantation and etching the annealed areas to allow the fabrication of multiple layer air bridges of single crystal semiconductor material.

38. The method of claim 28 further comprising the steps of etching an opening through the temporary region and the single crystal semiconductor material and filling it with conductive material.

39. The method of claim 28 where the conductive material is a metal, metal alloy, a silicide, or doped polycrystalline semiconductor material.

40. The method of claim 28 further comprising the step of increasing the thickness of the single crystal layer by epitaxial deposition.

* * * * *